United States Patent
Chen et al.

(10) Patent No.: US 9,030,343 B2
(45) Date of Patent: May 12, 2015

(54) COMMUNICATION DEVICE AND METHOD CAPABLE OF POWER CALIBRATION

(71) Applicant: Realtek Semiconductor Corporation, Hsinchu (TW)

(72) Inventors: Yu-Cheng Chen, Tainan (TW); Tsung-Hsuan Lee, Taipei (TW); Chung-Yao Chang, Hsinchu County (TW)

(73) Assignee: Realtek Semiconductor Corporation, Hsinchu (TW)

( * ) Notice: Subject to any disclaimer, the term of this patent is extended or adjusted under 35 U.S.C. 154(b) by 0 days.

(21) Appl. No.: 14/297,230

(22) Filed: Jun. 5, 2014

(65) Prior Publication Data
US 2015/0042497 A1   Feb. 12, 2015

(30) Foreign Application Priority Data
Aug. 7, 2013   (TW) .............. 102128326 A

(51) Int. Cl.
*H03M 1/10*   (2006.01)
*H03M 1/66*   (2006.01)

(52) U.S. Cl.
CPC .............. *H03M 1/1028* (2013.01); *H03M 1/66* (2013.01); *H03M 1/10* (2013.01)

(58) Field of Classification Search
CPC ........ H03M 1/10; H03M 1/66; H03M 1/1028
USPC ............. 341/120, 118, 119, 144; 455/522, 69
See application file for complete search history.

(56) References Cited

U.S. PATENT DOCUMENTS

| | | | | |
|---|---|---|---|---|
| 7,809,393 | B2 * | 10/2010 | Runze et al. | 455/522 |
| 7,873,340 | B2 * | 1/2011 | Li et al. | 455/234.1 |
| 7,956,699 | B2 * | 6/2011 | Matsuura et al. | 332/126 |
| 8,428,202 | B2 * | 4/2013 | Braicu et al. | 375/345 |

\* cited by examiner

*Primary Examiner* — Brian Young
(74) *Attorney, Agent, or Firm* — WPAT, P.C.; Anthony King

(57) ABSTRACT

The present invention discloses a communication device and a communication method capable of power calibration. Said communication device comprises: a digital circuit to provide a digital output signal; a detection circuit to perform a predetermined detection and generate a detection result; a control circuit to generate a digital-end and an analog-end gain adjustment signals according to the detection result; a digital-end gain adjustment circuit to adjust the gain of the digital output signal according to the digital-end gain adjustment signal and generate a digital gain-adjusted output signal; a digital-to-analog converter to generate an analog output signal according to the digital gain-adjusted output signal; and an analog circuit to adjust the gain of the analog output signal according to the analog-end gain adjustment signal and generate an analog gain-adjusted output signal, wherein the detection circuit is operable to detect the influence caused by a peripheral factor to the analog circuit.

18 Claims, 4 Drawing Sheets

US 9,030,343 B2

COMMUNICATION DEVICE AND METHOD CAPABLE OF POWER CALIBRATION

BACKGROUND OF THE INVENTION

1. Field of the Invention

The present invention relates to a communication device and method, especially to a communication device and method capable of power calibration.

2. Description of Related Art

Generally speaking, a communication device (such as a wireless network integrated circuit) without power calibration will generate signals of different transmission power under different working environment. For instance, if the communication device stays at a place where the temperature is high or rising, the power of transmission signals generated by the communication device will be low or go down correspondingly; on the contrary, if the communication device stays at a place wherein the temperature is low or falling, the power of transmission signals generated by the communication device will be high or rise up correspondingly. Therefore, in order to keep the signal stable and prevent the power of transmission signals from exceeding a normal range, the communication device is usually equipped with a power detection function to detect whether the signal power is under specification during transmission.

Please refer to FIG. 1 which illustrates a known technique performing power detection to the transmission signal of a communication device. As shown in FIG. 1, the known technique sets up a feedback mechanism at the transmission end of the communication device 100, which means that: an analog output circuit 110 will acquire the transmission signal; an index generating circuit 120 will generate a transmission signal power index according to the transmission signal; a comparator 130 will compare the transmission signal power index with a predetermined index to generate a comparison result; a gain control circuit 140 will generate a gain control signal according to the comparison result; and the analog output circuit 110 will adjust the gain of an input signal in accordance with the gain control signal to thereby generate the transmission signal. However, this known technique has the problems that: first, the index generating circuit 120 has to know whether the communication device 100 is under a transmission mode by someone's inform or a self-detection, so as to generate the transmission signal power index correctly; second, signals for different transmission conditions may be transmitted in different transmission power and thus the index generating circuit 120 has to generate the transmission signal power index of higher variation which consequently affects the stability of the power adjustment mechanism (i.e. said feedback mechanism). To prevent the above-mentioned problems, the comparator 130 needs more information and control for proper decision, which leads to a much more complicated power adjustment mechanism.

SUMMARY OF THE INVENTION

In view of the problems of the prior art, an object of the present invention is to provide a communication device and method capable of power calibration for improving the prior art.

The present invention discloses a communication device capable of power calibration. An embodiment of said communication device comprises: a digital circuit operable to provide a digital output signal; a detection circuit operable to perform a predetermined detection and generate a detection result; a control circuit, coupled to the detection circuit, operable to generate a digital-end gain adjustment signal and an analog-end gain adjustment signal according to the detection result; a digital-end gain adjustment circuit, coupled to the digital circuit and the control circuit, operable to adjust the gain of the digital output signal according to the digital-end gain adjustment signal and thereby generate a digital gain-adjusted output signal; a digital-to-analog converter, coupled to the digital-end gain adjustment circuit, operable to generate an analog output signal according to the digital gain-adjusted output signal; and an analog circuit, coupled to the digital-to-analog converter and the control circuit, operable to adjust the gain of the analog output signal according to the analog-end gain adjustment signal and thereby generate an analog gain-adjusted output signal, wherein the detection circuit is operable to detect the influence caused by a peripheral factor to the analog circuit.

The present invention also discloses a communication method capable of power calibration, which is carried out by the communication device of the present invention or the equivalent thereof. An embodiment of said communication method comprises the following steps: providing a digital output signal; performing a predetermined detection to generate a detection result; generating a digital-end gain adjustment signal and an analog-end gain adjustment signal according to the detection result; adjusting the gain of the digital output signal according to the digital-end gain adjustment signal to thereby generate a digital gain-adjusted output signal; generating an analog output signal according to the digital gain-adjusted output signal; and adjusting the gain of the analog output signal according to the analog-end gain adjustment signal to thereby generate an analog gain-adjusted output signal, wherein the predetermined detection is for detecting the influence caused by a peripheral factor to the analog output signal.

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The following description uses language by referring to terms in the field of this invention. If any term is defined in the specification, such term should be explained accordingly. Besides, the connection between objects or events in the disclosed embodiments can be direct or indirect provided that these embodiments are still applicable under such connection. Said "indirect" means that an intermediate object or a physical space is existed between the objects, or an intermediate event or a time interval is existed between the events. Furthermore, this invention relates to power calibration techniques, and the common knowledge in this field will be omitted if such knowledge has little to do with the features of the present invention.

The present invention contains a communication device and method capable of executing power calibration according to a detection result. Said device and method are applicable to an integrated circuit or a system device, and people of ordinary skill in the art can choose components or steps equivalent to those described in this specification to carry out the present invention provided that these alternative implementations are workable. Besides, since some element by itself of the communication device could be known, the detail of such element will be omitted provided that this omission nowhere dissatisfies the disclosure and enablement requirements. Similarly, since the communication method can be carried out by the communication device of the present invention or its equivalent, the following description will abridge the hardware details for executing the method but put the emphasis on the steps.

Figure 1:
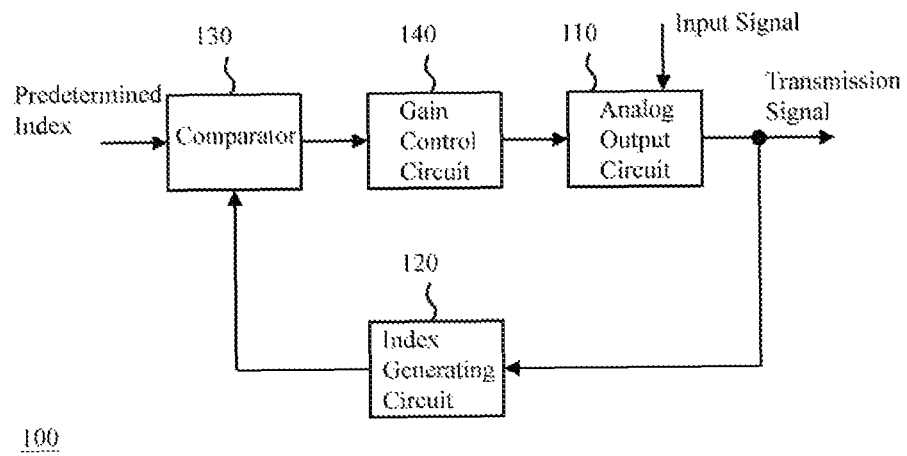
FIG. 1 illustrates a communication device capable of power calibration of the prior art.
Figure 2:
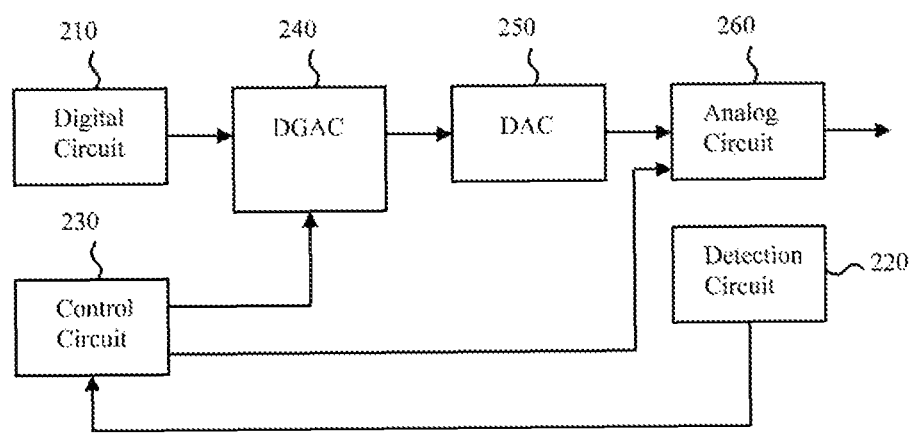
FIG. 2 illustrates an embodiment of the communication device capable of power calibration of the present invention.

Please refer to FIG. 2 which illustrates an embodiment of the communication device 200 of the present invention. This embodiment can carry out power calibration at both sides of the digital-end circuit and analog-end circuit according to a peripheral factor which reflects a neighboring circumstance condition. As shown in FIG. 2, the communication device 200 comprises: a digital circuit 210; a detection circuit 220; a control circuit 230; a digital-end gain adjustment circuit 240 (DGAC); a digital-to-analog converter 250 (DAC); and an analog circuit 260. Said digital circuit 210 is operable to provide a digital output signal; said detection circuit 220 is operable to execute a predetermined detection which detects the influence caused by a peripheral factor to the analog circuit 260, and thereby generate a detection result; said control circuit 230 is coupled with the detection circuit 220 and could be integrated into the digital circuit 210 or independent of the digital circuit 210, operable to generate a digital-end gain adjustment signal and an analog-end gain adjustment signal according to the detection result in which the two adjustment signals are digital signals in this embodiment; said digital-end gain adjustment circuit 240 (e.g. a digital multiplier) is coupled with the digital circuit 210 and the control circuit 230, and operable to adjust the gain of the aforementioned digital output signal from the digital circuit 210 according to the digital-end gain adjustment signal from the control circuit 230, so as to generate a digital gain-adjusted output signal; said digital-to-analog converter 250 is coupled with the digital-end gain adjustment circuit 240, and operable to generate an analog output signal according to the digital gain-adjusted output signal; and said analog circuit 260 is coupled with the digital-to-analog converter 250 and the control circuit 230, and operable to adjust the gain of the analog output signal according to the analog-end gain adjustment signal, so as to generate an analog gain-adjusted output signal. In this embodiment, the communication device 200 is a wireless network communication device; the peripheral factor indicates a temperature variation; the digital circuit 210 is a baseband circuit; the detection circuit 220 includes a temperature detection circuit, which implies that the aforementioned predetermined detection includes a temperature detection; and the analog circuit 260 is a radio-frequency circuit. Please note that these circuit implementations are exemplary for understanding, not for limiting the scope of the present invention. Besides, if the communication device 200 supports multiple input multiple output (MIMO) transmission, the digital-end gain adjustment circuit 240 could be composed of a plurality of digital-end gain adjustment units (not shown), the digital-to-analog converter 250 could be composed of a plurality of digital-to-analog converting units (not shown) and the analog circuit 260 could be composed of a plurality of analog units (not shown), so as to constitute a plurality of transmission paths for outputting transmission signals respectively in which each of the transmission paths includes one of said digital-end gain adjustment units, one of said digital-to-analog converting units and one of said analog units and all the transmission paths work in the same or similar way.

Figure 3:
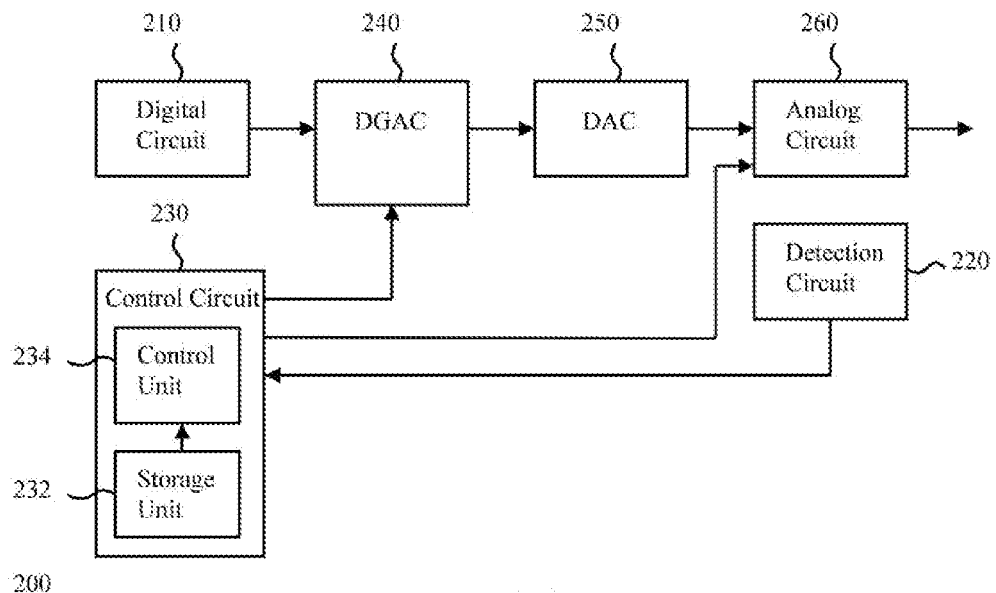
FIG. 3 illustrates an embodiment of the control circuit of FIG. 2.

Please refer to FIG. 3 which illustrates an embodiment of the control circuit 230. As shown in FIG. 3, the control circuit 230 includes: at least a storage unit 232 and a control unit 234. An example of said storage unit 232 includes a read only memory (ROM) unit and a non-volatile memory unit operable to store a basis value of the aforementioned peripheral factor and a mapping table respectively in which the mapping table indicates the relation between the peripheral factor and power calibration. Said control unit 234 is coupled with the storage unit 232 and the detection circuit 220, and operable to read the basis value of the peripheral factor and the mapping table, and thereby generate the digital-end gain adjustment signal and the analog-end gain adjustment signal according to the detection result, the basis value and the mapping table. An example of said basis value of the peripheral factor is a temperature nominal value given in a product test process or a standard working temperature value; and an example of said mapping table is illustrated by the following table 1 defining the relation between transmission condition (i.e. transmission frequency band (e.g. 2G or 5G) column, transmission path (e.g. path A or path B) column, and temperature trend (e.g. rising temperature ↑ and descending temperature ↓) column) and temperature variation. With the mapping table, as long as the transmission condition and temperature variation $\Delta T$ are known, the control unit 234 is able to look the gain adjustment value (while value 1 indicates 0.5 dB in this embodiment) up in the mapping table to thereby generate the digital-end and analog-end gain adjustment signals; more specifically, the control unit 234 can find out a gain adjustment value in the mapping table according to the given transmission condition and the difference between the current temperature value detected by the detection circuit 220 and the temperature nominal value, and then generate the digital-end and analog-end gain adjustment signals. Please note that the formation of the mapping table is illustrative for understanding, and those of ordinary skill in the art can appreciate how to modify the mapping table according to their own demand or design resources. For instance, one can make the control unit 234 determine a gain adjustment value by merely referring to the transmission conditions of frequency band and temperature trend plus the temperature variation, or determine a gain adjustment value by referring to more or different transmission conditions (e.g. modulation modes (such as complementary code keying, CCK; or orthogonal frequency division multiplexing, OFDM), modulation and coding schemes (MCS), and etc.), enlarging the mapping range of temperature variation, changing the variation step or unit of the temperature variation, and etc. Please also note that the mentioned temperature nominal value could vary by production conditions, periphery designs and applications of the communication circuit 200; for instance, the temperature nominal value of the communication circuit 200 could change because of the integration density or heat dissipation capability.

TABLE 1

| Transmission Condition | | | Gain Adjustment Value | Temperature Variation ΔT (Unit: Detection Resolution of Detection Circuit 220) | | | | | | |
|---|---|---|---|---|---|---|---|---|---|---|
| Freq. Band | Path | Temp. Trend | | ΔT = 0 | ΔT = 1 | ΔT = 2 | ΔT = 3 | ΔT = 4 | ΔT = 5 | ΔT = 6 |
| 2G | A | ↑ | | 0 | 0 | 1 | 1 | 2 | 2 | 2 |
| 2G | A | ↓ | | 0 | 1 | 1 | 1 | 2 | 2 | 2 |
| 2G | B | ↑ | | 0 | 0 | 1 | 1 | 2 | 2 | 2 |
| 2G | B | ↓ | | 0 | 1 | 1 | 1 | 2 | 2 | 2 |
| 5G | A | ↑ | | 0 | 1 | 1 | 3 | 4 | 5 | 6 |
| 5G | A | ↓ | | 0 | 1 | 2 | 3 | 3 | 5 | 5 |
| 5G | B | ↑ | | 0 | 1 | 1 | 3 | 4 | 5 | 6 |
| 5G | B | ↓ | | 0 | 1 | 2 | 3 | 3 | 5 | 5 |

Please refer to FIG. 3 again. In this embodiment, the control unit 234 can further determine the weightiness of the digital-end and analog-end gain adjustment signals according to the detection result, the basis value of the peripheral factor and the mapping table in which the weightiness could be constant or adjustable. For instance, if the amount of power adjustment is supposed to be +3 dB, the control unit 234 may make the digital-end gain adjustment circuit 240 contribute the power adjustment amount by +2.5 dB (or +2 dB, or +1.6 dB, or etc.) through the digital-end gain adjustment signal, and concurrently make the analog circuit 260 contribute the power adjustment amount by +0.5 dB (or +1 dB, or +1.4 dB, or etc.) through the analog-end gain adjustment signal. Since people of ordinary skill in the art can appreciate how to set the weightiness of the two adjustment signals in accordance with their own demand or design requirements, similar examples will therefore be omitted. Please note that in consideration of that digital adjustment is usually more accurate than analog adjustment, in this embodiment the control unit 234 will have the weightiness of the digital-end gain adjustment signal dominant, that is to say the weightiness of the digital-end gain adjustment signal equal to or more significant than the weightiness of the analog-end gain adjustment signal; however, this is an option, rather than a limitation, left for a practitioner to decide.

Figure 4:
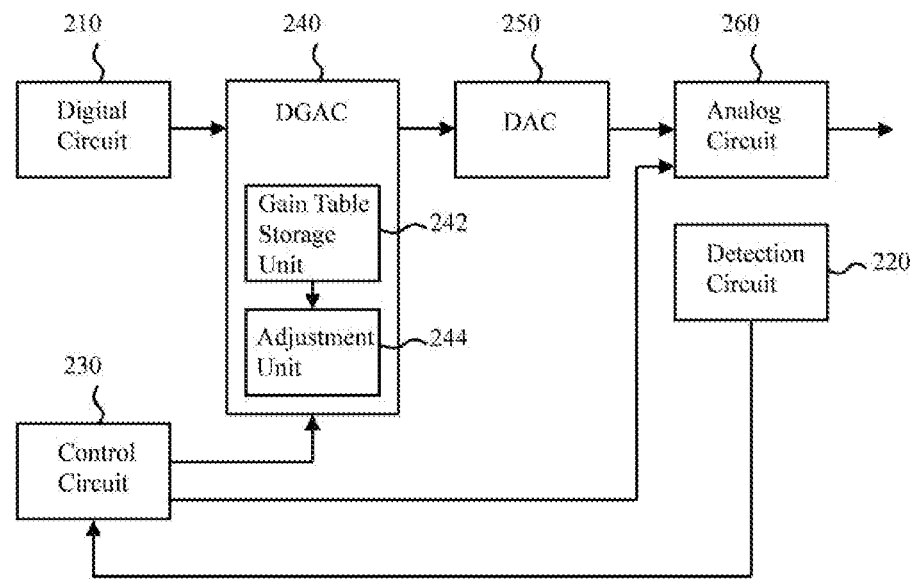
FIG. 4 illustrates an embodiment of the digital-end gain adjustment circuit of FIG. 2.

Please refer to FIG. 2 and FIG. 3. In consideration of that the digital circuit 210 and analog circuit 260 may support different upper limits of output power respectively, the control circuit 230 may further determine the weightiness of the digital-end gain adjustment signal according to a predetermined upper limit (i.e. the upper limit of output power for the digital circuit 210) which could be constant or variable. Once the weightiness of the digital-end gain adjustment signal is set, the weightiness of the analog-end gain adjustment signal will be set correspondingly. Furthermore, please refer to FIG. 4. An embodiment of said digital-end gain adjustment circuit 240 includes: a gain table storage unit 242 and an adjustment unit 244. Said gain table storage unit 242 is operable to store a gain table which is illustrated by the following table 2 including a gain adjustment value column (in which value 0.5 dB in table 2 corresponds to value 1 in table 1) in connection with the digital-end gain adjustment signal; and said adjustment unit 244 is coupled to the gain table storage unit 242, the digital circuit 210 and the control circuit 230, and operable to read the gain adjustment value from the gain table according to the digital-end gain adjustment signal and thereby modify the gain of the digital output signal to generate the digital gain-adjusted output signal. Moreover, please refer to FIG. 2. An embodiment of the analog circuit 260 includes an analog-end gain adjustment circuit (not shown) such as an auto gain control (AGC) circuit for adjusting the gain of the analog output signal according to the analog-end gain adjustment signal, so as to generate the aforementioned analog gain-adjusted output signal. Because the analog-end gain adjustment circuit is well known, the detail thereof will be omitted for conciseness.

TABLE 2

| Power Adjustment Value | Gain Adjustment Value |
|---|---|
| +3.0 dB | 1.4125 |
| +2.5 dB | 1.3335 |
| +2.0 dB | 1.2589 |
| +1.5 dB | 1.1885 |
| +1.0 dB | 1.1220 |
| +0.5 dB | 1.0593 |
| 0 dB | 1.0000 |
| −0.5 dB | 0.9441 |
| −1.0 dB | 0.8913 |
| −1.5 dB | 0.8414 |
| −2.0 dB | 0.7943 |
| −2.5 dB | 0.7499 |
| −3.0 dB | 0.7079 |

Figure 5:
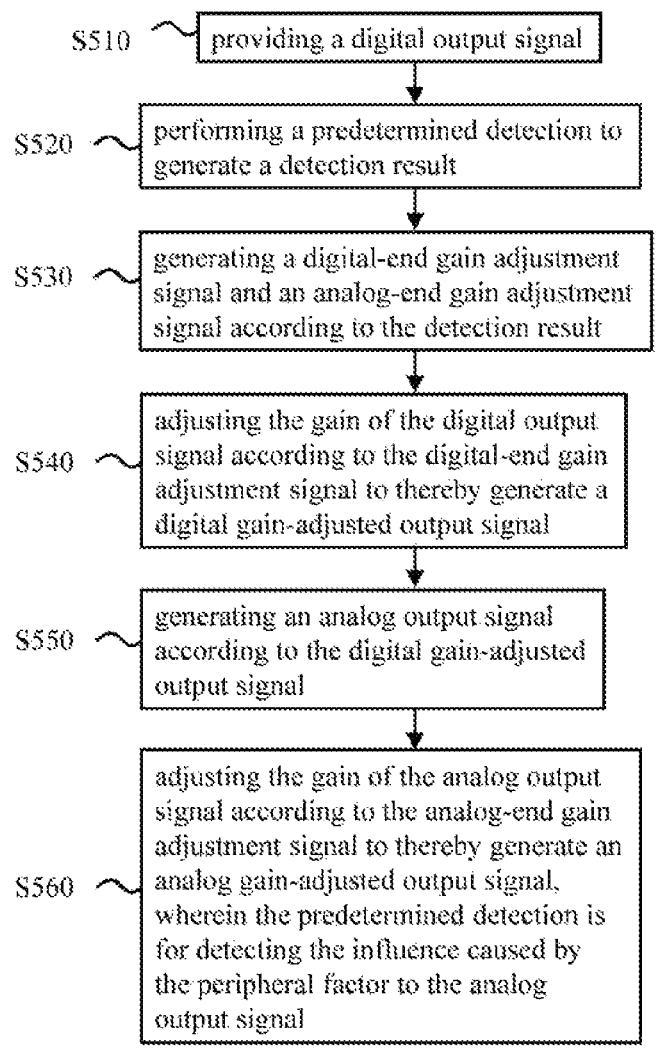
FIG. 5 illustrates an embodiment of the communication method capable of power calibration of the present invention.

In addition to the above-disclosed communication device 200, the present invention further discloses a communication method capable of doing power calibration according to a detection result. This method can be carried out by the communication device 200 or its equivalent. As shown in FIG. 5, an embodiment of the method comprises:

Step S510: providing a digital output signal.

Step S520: performing a predetermined detection to generate a detection result.

Step S530: generating a digital-end gain adjustment signal and an analog-end gain adjustment signal according to the detection result. In this embodiment, step S530 further includes: providing a basis value of a peripheral factor (which reflects a neighboring circumstance condition) and a mapping table in which the mapping table indicates the relation between the peripheral factor and power calibration; and reading the basis value of the peripheral factor and the mapping table to generate the digital-end and analog-end gain adjustment signals according to the detection result, the basis value and the mapping table.

Step S540: adjusting the gain of the digital output signal according to the digital-end gain adjustment signal to thereby generate a digital gain-adjusted output signal. In this embodiment, step S540 further includes: providing a gain table which includes a gain adjustment value in connection with the digital-end gain adjustment signal; and reading a gain adjustment value from the gain table according to the digital-end gain adjustment signal to thereby modify the gain of the digital output signal and then generate the digital gain-adjusted output signal.

Step S550: generating an analog output signal according to the digital gain-adjusted output signal.

Step S560: adjusting the gain of the analog output signal according to the analog-end gain adjustment signal to thereby generate an analog gain-adjusted output signal, wherein the predetermined detection of step S520 is for detecting the influence caused by the peripheral factor to the analog output signal.

In this embodiment, the communication method is a wireless communication method; the digital output signal is a baseband signal; the predetermined detection is a predetermined temperature detection, which means that the peripheral factor reflects a temperature variation; and the analog gain-adjusted output signal is a radio-frequency signal. Besides, step S530 may further include: determining the weightiness of the digital-end and analog-end gain adjustment signals according to the detection result, the basis value and the mapping table in which the weightiness could be constant or adjustable. For instance, step S530 may have the weightiness of the digital-end gain adjustment signal dominant, which means that the weightiness of the digital-end gain adjustment signal is more significant than the weightiness of the analog-end gain adjustment signal to pursue the goal of performance; more specifically, step S530 may determine the weightiness of the digital-end gain adjustment signal preferentially according to a predetermined upper limit which is constant or adjustable for regulating the power of the digital gain-adjusted output signal, and once the weightiness of the digital-end gain adjustment signal is set, the weightiness of the analog-end gain adjustment circuit will be set consequently. In an alternative embodiment, the predetermined upper limit is associated with the modulation order of transmission signal. For example, the predetermined upper limit for 256QAM (Quadrature Amplitude Modulation) is +1.5 dB, 64QAM is +3 dB, and 16QAM is +5 dB.

Figure 6:
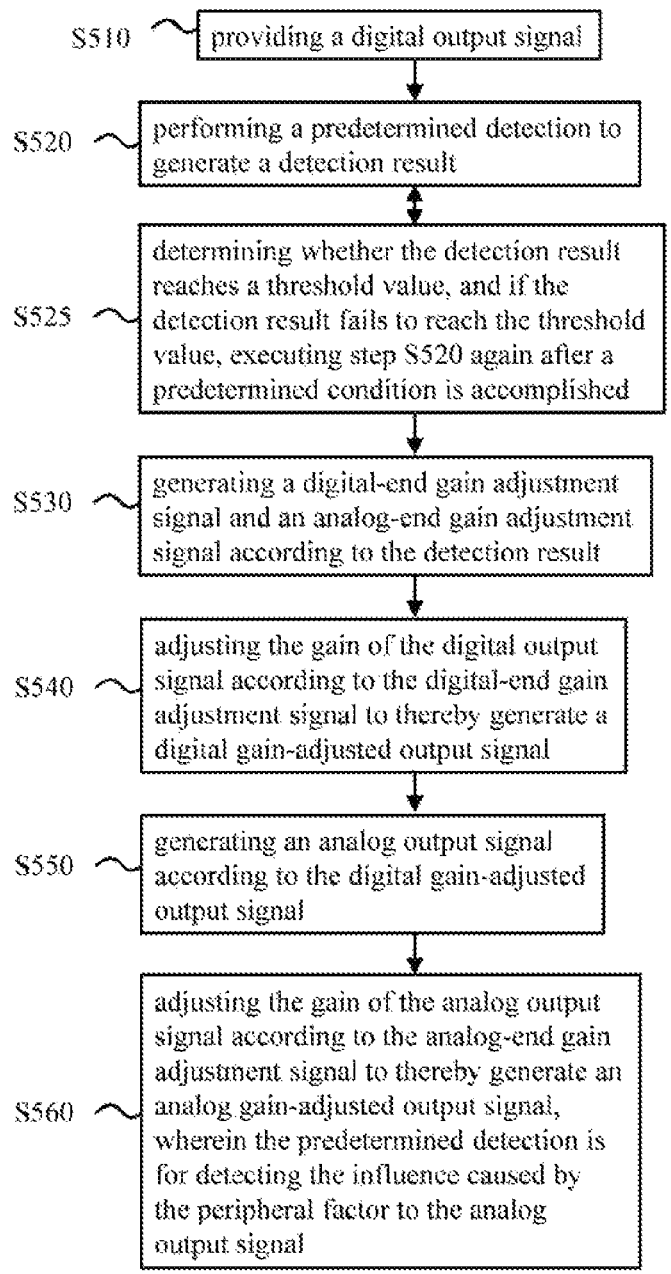
FIG. 6 illustrates another embodiment of the communication method capable of power calibration of the present invention.

Please refer to FIG. 6 which illustrates another embodiment of the communication method of the present invention. Compared with the embodiment of FIG. 5, this embodiment further comprises the following step:

Step S525: before executing step S530, determining whether the detection result reaches a threshold value, and if the detection result fails to reach the threshold value, which means that there is no need to carry out gain adjustment at this moment, executing step S520 again after a predetermined condition (e.g. a predetermined period or a counting value) is accomplished.

To be more specific, step S525 may execute the following steps to find out whether the detection result reaches the threshold value: providing a basis value of a peripheral factor and a mapping table (which could be the same as those mentioned in step S530) while the mapping table indicates the relation between the peripheral factor and power calibration; and reading the basis value of the peripheral factor and the mapping table to determine whether the detection result reaches the threshold value according to the detection result, the basis value and the mapping table.

Since those of ordinary skill in the art can appreciate the implementation detail and modification of the present method invention in accordance with the description of the foredisclosed device invention, repeated and redundant explanation will therefore be omitted. Please note that, the shape, size, and scale of any element and the step sequence of any flow chart in the disclosed figures are just exemplary for understanding, not for limiting the scope of the present invention. Please also note that, each embodiment in the following description includes one or more features, but this doesn't mean that one carrying out the present invention should make use of all the features of one embodiment at the same time, or should only carry out different embodiments separately. In other words, if an implementation derived from one or more of the embodiments is applicable, a person of ordinary skill in the art can selectively make use of some or all of the features in one embodiment or selectively make use of the combination of some or all features in several embodiments to have the implementation come true, so as to increase the flexibility in carrying out the present invention.

In conclusion, the communication device and method of the present invention capable of power calibration have at least the following advantages: simplifying the power detection mechanism because the present invention has no need to detect whether the communication device is under transmission; having power adjustment stable because the present invention is free from the influence caused by upper layer applications of the communication device (while different upper layer applications may require different packet types for transmission, which implies different transmission power); determining the transmission power according to the given transmission condition and the detected temperature variation with the pre-stored mapping table in which the mapping table could be modified easily when any setting is going to be added or updated; and having the adjustment range and flexibility increased through the gain adjustment at both of the digital and analog ends.

The aforementioned descriptions represent merely the preferred embodiment of the present invention, without any intention to limit the scope of the present invention thereto. Various equivalent changes, alterations, or modifications based on the claims of present invention are all consequently viewed as being embraced by the scope of the present invention.

What is claimed is:

1. A communication device capable of power calibration, comprising:
 a digital circuit operable to provide a digital output signal;
 a detection circuit operable to perform a predetermined detection and generate a detection result;
 a control circuit, coupled to the detection circuit, operable to generate a digital-end gain adjustment signal and an analog-end gain adjustment signal according to the detection result;
 a digital-end gain adjustment circuit, coupled to the digital circuit and the control circuit, operable to adjust the gain of the digital output signal according to the digital-end gain adjustment signal and thereby generate a digital gain-adjusted output signal;
 a digital-to-analog converter, coupled to the digital-end gain adjustment circuit, operable to generate an analog output signal according to the digital gain-adjusted output signal; and
 an analog circuit, coupled to the digital-to-analog converter and the control circuit, operable to adjust the gain of the analog output signal according to the analog-end gain adjustment signal and thereby generate an analog gain-adjusted output signal,
 wherein the detection circuit is operable to detect the influence caused by a peripheral factor to the analog circuit, the communication device is a wireless communication device, the digital circuit is a baseband circuit and the analog circuit is a radio-frequency circuit.

2. The communication device capable of power calibration of claim 1, wherein the detection circuit includes a temperature detecting circuit, the predetermined detection is a temperature detection and the peripheral factor is a temperature variation.

3. A communication device capable of power calibration, comprising:
a digital circuit operable to provide a digital output signal;
a detection circuit operable to perform a predetermined detection and generate a detection result;
a control circuit, coupled to the detection circuit, operable to generate a digital-end gain adjustment signal and an analog-end gain adjustment signal according to the detection result, the control circuit including:
at least one storage unit operable to store a basis value of the peripheral factor and a mapping table in which the mapping table indicates the relation between the peripheral factor and power calibration; and
a control unit, coupled to the storage unit and the detection circuit, operable to read the basis value and the mapping table and generate the digital-end and analog-end gain adjustment signals according to the detection result, the basis value and the mapping table;
a digital-end gain adjustment circuit, coupled to the digital circuit and the control circuit, operable to adjust the gain of the digital output signal according to the digital-end gain adjustment signal and thereby generate a digital gain-adjusted output signal;
a digital-to-analog converter, coupled to the digital-end gain adjustment circuit, operable to generate an analog output signal according to the digital gain-adjusted output signal; and
an analog circuit, coupled to the digital-to-analog converter and the control circuit, operable to adjust the gain of the analog output signal according to the analog-end gain adjustment signal and thereby generate an analog gain-adjusted output signal,
wherein the detection circuit is operable to detect the influence caused by a peripheral factor to the analog circuit.

4. The communication device capable of power calibration of claim 3, wherein the control unit further determines the weightiness of the digital-end and analog-end gain adjustment signals according to the detection result, the basis value and the mapping table in which the weightiness is constant or adjustable.

5. The communication device capable of power calibration of claim 4, wherein the control unit has the weightiness of the digital-end gain adjustment signal more significant than the weightiness of the analog-end gain adjustment signal.

6. The communication device capable of power calibration of claim 5, wherein the control unit further determines the weightiness of the digital-end gain adjustment signal according to a predetermined upper limit which is constant or adjustable.

7. The communication device capable of power calibration of claim 3, wherein the control circuit is integrated into the digital circuit.

8. A communication device capable of power calibration, comprising:
a digital circuit operable to provide a digital output signal;
a detection circuit operable to perform a predetermined detection and generate a detection result;
a control circuit, coupled to the detection circuit, operable to generate a digital-end gain adjustment signal and an analog-end gain adjustment signal according to the detection result;
a digital-end gain adjustment circuit, coupled to the digital circuit and the control circuit, operable to adjust the gain of the digital output signal according to the digital-end gain adjustment signal and thereby generate a digital gain-adjusted output signal, the digital-end gain adjustment circuit including:
a gain table storage unit operable to store a gain table which includes a gain adjustment value in connection with the digital-end gain adjustment signal; and
an adjustment unit, coupled to the gain table storage unit, the digital circuit and the control circuit, operable to read the gain adjustment value from the gain table according to the digital-end gain adjustment signal and thereby modify the gain of the digital output signal to generate the digital gain-adjusted output signal;
a digital-to-analog converter, coupled to the digital-end gain adjustment circuit, operable to generate an analog output signal according to the digital gain-adjusted output signal; and
an analog circuit, coupled to the digital-to-analog converter and the control circuit, operable to adjust the gain of the analog output signal according to the analog-end gain adjustment signal and thereby generate an analog gain-adjusted output signal,
wherein the detection circuit is operable to detect the influence caused by a peripheral factor to the analog circuit.

9. The communication device capable of power calibration of claim 1, wherein the analog circuit includes an analog-end gain adjustment circuit operable to adjust the gain of the analog-end gain adjustment signal and thereby generate the analog gain-adjusted output signal.

10. A communication method capable of power calibration, which is carried out by a communication device capable of power calibration and comprises the following steps:
providing a digital output signal;
performing a predetermined detection to generate a detection result;
generating a digital-end gain adjustment signal and an analog-end gain adjustment signal according to the detection result;
adjusting the gain of the digital output signal according to the digital-end gain adjustment signal to thereby generate a digital gain-adjusted output signal;
generating an analog output signal according to the digital gain-adjusted output signal; and
adjusting the gain of the analog output signal according to the analog-end gain adjustment signal to thereby generate an analog gain-adjusted output signal,
wherein the predetermined detection is for detecting the influence caused by a peripheral factor to the analog output signal, the communication method is a wireless communication method, the digital output signal is a baseband signal and the analog gain-adjusted output signal is a radio-frequency signal.

11. The communication method capable of power calibration of claim 10, wherein the predetermined detection is a temperature detection and the peripheral factor is a temperature variation.

12. The communication method capable of power calibration of claim 10, wherein the step of generating the digital-end and analog-end gain adjustment signals includes:
providing a basis value of the peripheral factor and a mapping table in which the mapping table indicates the relation between the peripheral factor and power calibration; and reading the basis value and the mapping table to generate the digital-end and analog-end gain adjustment signals according to the detection result, the basis value and the mapping table.

13. The communication method capable of power calibration of claim 12, wherein the step of generating the digital-end and analog-end gain adjustment signals further includes:
   determining the weightiness of the digital-end and analog-end gain adjustment signals according to the detection result, the basis value and the mapping table in which the weightiness is constant or adjustable.

14. The communication method capable of power calibration of claim 13, wherein the step of generating the digital-end and analog-end gain adjustment signals includes:
   having the weightiness of the digital-end gain adjustment signal more significant than the weightiness of the analog-end gain adjustment signal.

15. The communication method capable of power calibration of claim 14, wherein the step of generating the digital-end and analog-end gain adjustment signal further includes:
   determining the weightiness of the digital-end gain adjustment signal according to a predetermined upper limit which is constant or adjustable.

16. The communication method capable of power calibration of claim 10, wherein the step of generating the digital gain-adjusted output signal includes:
   providing a gain table which includes a gain adjustment value in connection with the digital-end gain adjustment signal; and
   reading the gain adjustment value from the gain table according to the digital-end gain adjustment signal to thereby modify the gain of the digital output signal and generate the digital gain-adjusted output signal.

17. The communication method capable of power calibration of claim 10, further comprising:
   before executing the step of generating the digital-end and analog-end gain adjustment signals, determining whether the detection result reaches a threshold value, and if the detection result fails to reach the threshold value, executing the step of generating the detection result again after a predetermined condition is accomplished.

18. The communication method capable of power calibration of claim 17, wherein the step of determining whether the detection result reaches the threshold includes:
   providing a basis value of the peripheral factor and a mapping table which indicates the relation between the peripheral factor and power calibration; and
   reading the basis value and the mapping table to determine whether the detection result reaches the threshold value according to the detection result, the basis value and the mapping table.

* * * * *